United States Patent [19]

Yoshida et al.

[11] Patent Number: 4,623,610
[45] Date of Patent: Nov. 18, 1986

[54] POSITIVE IMAGE-FORMING METHOD USING 4-METHYL-1-PENTENE POLYMER

[75] Inventors: Hiromi Yoshida, Tokyo; Masataka Miyamura, Kawasaki; Katsumi Funakoshi, Iwakuni; Riichiro Nagano, Yamaguchi, all of Japan

[73] Assignees: Tokyo Shibaura Denki Kabushiki Kaisha, Kawasaki; Mitsui Petrochemical Industries, Ltd., Tokyo, both of Japan

[21] Appl. No.: 353,001

[22] Filed: Feb. 26, 1982

Related U.S. Application Data

[63] Continuation of Ser. No. 102,916, Dec. 12, 1979, abandoned.

[30] Foreign Application Priority Data

Dec. 12, 1978 [JP] Japan .................................. 53-153418

[51] Int. Cl.$^4$ ............................................... G03C 5/00
[52] U.S. Cl. .................................... 430/326; 430/270; 430/296; 430/905; 430/907; 525/319; 525/320; 526/347; 526/348.6
[58] Field of Search ............... 430/270, 296, 326, 905, 430/907; 204/159.18; 525/319, 320, 242; 526/348.6, 347

[56] References Cited

U.S. PATENT DOCUMENTS

| | | | |
|---|---|---|---|
| 3,432,577 | 3/1969 | Serniuk | 525/319 |
| 3,860,538 | 1/1975 | Guillet | 260/2.5 |
| 3,893,127 | 7/1975 | Kaplan et al. | 430/296 |
| 3,935,332 | 1/1976 | Poliniak et al. | 430/296 |
| 4,056,499 | 11/1977 | Taylor | 204/159.14 |
| 4,056,665 | 11/1977 | Taylor et al. | 204/159.14 |
| 4,133,944 | 1/1979 | Cooper et al. | 526/348.6 |

*Primary Examiner*—Jack P. Brammer
*Attorney, Agent, or Firm*—Oblon, Fisher, Spivak, McClelland, & Maier

[57] ABSTRACT

A positive image-forming material consisting of a methylpentene homopolymer or a methylpentene copolymer containing 50 mole percent or more of methylpentene units which has an intrinsic viscosity of not less than 0.2 dl/g as measured in decalin at 135° C. and being soluble in not more than 100 times by weight of cyclohexene at 25° C.

6 Claims, No Drawings

POSITIVE IMAGE-FORMING METHOD USING 4-METHYL-1-PENTENE POLYMER

This is a continuation, of application Ser. No. 102,916, filed Dec. 12, 1979, now abandoned.

BACKGROUND OF THE INVENTION

This invention relates to materials suitable for the formation of images by exposure to light or other forms of radiation. More particularly, it relates to a positive image-forming material which has high sensitivity and high resolution and is easy to handle.

Among the image-forming materials are positive image-forming materials of which the portion exposed to light or other forms of radiation such as electron beams, X-rays, gamma rays, and alpha rays undergoes a photochemical reaction or degradation reaction and thereby becomes soluble in a liquid developer. These positive image-forming materials are suitable for the formation of fine patterns and for information recording. A number of positive image-forming materials such as quinone diazides, polymethacrylic acid esters, and poly-1-butene sulfone are well known in the prior art, but all of them are low in sensitivity and have small $\gamma$-values as calculated from their photosensitivity characteristic curves. Their low sensitivity requires large exposure doses of light or radiation and/or long exposure times and thus cause practical inconvenience. Moreover, their small $\gamma$-values causes the incident light or radiation to be reflected or back-scattered from the substrate, making difficult the formation of fine images. Especially in the case of information recording, these positive image-forming materials fail to achieve high resolution and thus lead to a reduction in information storage density.

Many attempts have been made to improve the sensitivity of these conventional positive image-forming materials and enhance the resolution thereof. For example, the use of polymethacrylic acid esters having a molecular weight of 1,000,000 or more has been proposed, but this cannot be regarded as practicable because such polymers are very difficult to synthesize. Thus, these attempts have so far produced no satisfactory results.

Furthermore, these conventional positive image-forming materials have the additional disadvantage that their adhesion to glass substrates, metal substrates, and synthetic resin films is poor. For this reason, the photosensitive layer formed on a substrate often produces pinholes and/or undergoes delamination during its development. This disadvantage can be partially overcome by improving the process conditions, for example, by pretreatment of the substrate with an organosilicone compound or by selection of proper prebaking temperature and time as well as appropriate developing conditions. However, no perfect resolution has been found.

SUMMARY OF THE INVENTION

It is an object of the present invention to provide a positive image-forming material which has high sensitivity and high resolution and is easy to handle.

It is another object of the present invention to provide a simple method of forming a fine positive image on a semiconductor substrate.

According to the present invention, there is provided a positive image-forming material consisting of a methylpentene homopolymer or a methylpentene copolymer containing 50 mole percent or more of methylpentene, said methylpentene homopolymer or copolymer having an intrinsic viscosity of not less than 0.2 dl/g as measured in decalin at 135° C. and being soluble in not more than 100 times by weight of cyclohexene at 25° C.

DETAILED DESCRIPTION OF THE PREFERRED EMBODIMENT

The methylpentene polymer of the present invention, which is characterized by the above-described properties, can be obtained by degrading or denaturing a conventional methylpentene polymer to a certain desired degree. The conventional methylpentene polymers which can be used as starting materials include homopolymers and copolymers composed of one or more methylpentenes, particularly methyl-1-pentenes such as 2-methyl-1-pentene, 3-methyl-1-pentene, 4-methyl-1-pentene, 3,3-dimethyl-1-pentene, 3,4-dimethyl-1-pentene, 4,4-dimethyl-1-pentene, 2,3,3-trimethyl-1-pentene, 2,3,4-trimethyl-1-pentene, 2,4,4-trimethyl-1-pentene, etc. In addition copolymers of the foregoing methylpentenes with other $\alpha$-olefins such as ethylene, propylene, 1-butene, 1-hexene, 1-octene, 1-decene, 1-dodecene, 1-tetradecene, 1-octadecene, etc. can also be used as starting materials. These methylpentene copolymers with other $\alpha$-olefins should have a methylpentene content of 80 mole percent or more and preferably 90 mole percent or more. Among these starting materials, homopolymers and copolymers of 4-methyl-1-pentene are preferred. It is disclosed in U.S. patent application Ser. No. 28,909 filed Apr. 10, 1979 in the name of H. Yoshida et al. that the conventional methylpentene homopolymers and copolymers which can be used as starting materials in the present invention are also useful as positive image-forming materials. These conventional methylpentene homopolymers and copolymers can usually be prepared by the Ziegler polymerization process. However, these conventional methylpentene homopolymers and copolymers do not dissolve in 100 times by weight of cyclohexene but only make it cloudy. This insufficient solubility in solvents leads to the great disadvantage that they do not permit us to form their coating film at room temperature.

The degradation or denaturation of the above-described starting materials may be carried out according to a number of techniques such as the use of a free-radical initiator, thermal decomposition, and exposure to radiation (for example, gamma rays, X-rays, ultraviolet rays, and the like). Among these techniques, the use of a free-radical initiator is most preferred.

The free-radical initiators suitable for the above-described purpose are organic peroxides. Typical examples thereof include alkyl peroxides such as diisopropyl peroxide, di-tert-butyl peroxide, 2,5-dimethyl-2,5-di-tert-butylperoxyhexyne-3, etc.; aryl peroxides such as dicumyl peroxide, etc.; acyl peroxides such as dilauroyl peroxide, etc.; aroyl peroxides such as dibenzoyl peroxide, etc.; ketone peroxides such as methyl ethyl ketone peroxide, cyclohexanone peroxide, etc.; peroxycarbonates; peroxycarboxylates; hydroperoxides such as tert-butyl hydroperoxide, cumene hydroperoxide, etc.; and the like. In addition to these organic peroxides, azonitriles such as azobisisobutyronitrile, azobisisopropionitrile, etc. can also be used.

In order to degrade a starting material (i.e. a conventional methylpentene homopolymer or copolymer as prepared by the Ziegler polymerization process) in the presence of a free-radical initiator, 100 parts by weight of the starting material is mixed with from 0.01 to 1,000 parts by weight of the free-radical initiator. The resulting mixture is kept at a temperature of from 100° to 400° C. for a period of time ranging from 0.5 minute to 10 hours. These degradation conditions should be determined so that the intrinsic viscosity [$\eta$] of the final product is equal to from 0.1 to 50% and preferably from 2 to 20% of that of the starting material. More specifically, a starting material is dissolved in a solvent selected from aliphatic hydrocarbons, alicyclic hydrocarbons, aromatic hydrocarbons, and halogenated derivatives thereof. In this solution, the starting material is used in an amount of from 0.1 to 1,000 gram per liter of the solvent. Then, a free-radical initiator is added thereto in an amount of from 2 to 1,000 parts by weight per 100 parts by weight of the starting material. The resulting mixture is kept at a temperature of from 100° to 250° C. for a period of time ranging from 10 minutes to 10 hours. Alternatively, a starting material may be degraded in the molten state without using any solvent. In this case, 100 parts by weight of the starting material is mixed with from 0.01 to 10 parts by weight of a free-radical initiator, and the resulting mixture is kept at a temperature of from 200° to 400° C. for a period of time ranging from 0.5 to 10 minutes.

As a result of the above-described degradation, there is obtained a methylpentene homopolymer or copolymer which has an intrinsic viscosity [$\eta$] of not less than 0.2 dl/g as measured in decalin at 135° C. and is soluble in not more than 100 times by weight and preferably about 30 times by weight of cyclohexene at 25° C. The expression "soluble in cyclohexene at 25° C.", as used herein, means not only that the methylpentene homopolymer or copolymer directly dissolves in cyclohexene at 25° C., but also that, when the methylpentene homopolymer or copolymer is added to cyclohexene at 25° C., heated to 70° C. at a rate of 25° C. per hour, held at that temperature for 2 hours, and then cooled to 25° C. at a rate of 25° C. per hour, the resulting solution is perfectly clear and contains no suspended matter upon visual inspection. The intrinsic viscosity [$\eta$] of the methylpentene homopolymer or copolymer of this invention is preferably from 0.2 to 10.0 dl/g, more preferably from 0.4 to 5.0 dl/g, and most preferably from 0.5 to 3.8 dl/g.

The methylpentene homopolymer or copolymer obtained by the degradation of a starting material contains the same polymeric units as the starting material does, but the content of methylpentene units is decreased in many cases. This decrease in the content of methylpentene units is caused partially by the decomposition of polymeric side chains and the formation of $\alpha$-olefin units containing fewer carbon atoms, and partially by the formation of new polymeric units as a result of the addition of hydrocarbon radicals derived from the free-radical initiator and/or solvent used. The content of methylpentene units can be determined on the basis of infrared absorption spectra. In the case of a degradation product obtained from a homopolymer of 4-methyl-1-pentene, for example, a solution of the degradation product in a suitable solvent and a solution of a homopolymer of 4-methyl-1-pentene in the same solvent are prepared and then subjected to infrared spectrophotometer. In the resulting infrared absorption spectra, the absorbance of the maximum absorption band, in the vicinity of 1,365 cm$^{-1}$, coming from the isobutyl radical is measured. Then, the content of 4-methyl-1-pentene units can be calculated from the ratio of the measured value of the degradation product to that of the homopolymer. Where the degraded methylpentene copolymer is used as a positive image-forming material, its content of methylpentene units should be 50 mole percent or more, preferably 70 mole percent or more, and most preferably 90 mole percent or more.

The melting point of the degraded methylpentene homopolymer or copolymer is about 5° to 100° C. lower than that of the starting material, and is often split into two values. For example, a homopolymer of 4-methyl-1-pentene prepared by the Ziegler polymerization process has a maximum melting point of from 235° to 240° C., whereas the degradation product thereof has a maximum melting point of from 140° to 235° C., preferably from 180° to 230° C., and most preferably from 200° to 225° C. In the present invention, the melting points of methylpentene homopolymers and copolymers are measured in the following manner: A sample is charged into a differential scanning calorimeter and heated from room temperature at a rate of 20° C. per minute. As soon as its temperature reached 250° C., it is cooled to 25° C. at a rate of 20° C. per minute and heated again at a rate of 20° C. per minute, during which its melting point is read from the observed melting peak.

The degraded methylpentene homopolymer or copolymer having the above-described properties provides the positive image-forming material of the present invention. When compared with the methylpentene homopolymer or copolymer disclosed in the aforementioned U.S. patent application Ser. No. 28,909, the positive image-forming material of the present invention not only shows enhancement in sensitivity and $\gamma$-value, but also is very easy to handle because its improved solubility in a solvent enables us to apply it to a substrate at room temperature.

Then, the formation of images by using the image-forming material of the present invention is exemplified by the following procedure.

A methylpentene homopolymer or copolymer having the above-described properties is dissolved in a suitable solvent to prepare a solution having a concentration of the order of from 0.5 to 5% by weight. Although room temperature is usually sufficient to dissolve the methylpentene homopolymer or copolymer, higher temperatures may be used, if necessary. Thereafter, the resulting solution is applied to a substrate at room temperature to form thereon a photosensitive layer having a thickness of the order of from 0.2 to 2 $\mu$m. The photosensitive layer so formed is prebaked at a temperature, for example, of the order of from 150° to 220° C. to remove the solvent therefrom. Then, using a suitable image-forming apparatus, a desired latent image is formed in the photosensitive layer on the substrate, which is finally developed to form a positive image.

The suitable solvents which can be used in the above-described procedure are hydrocarbons and halogenated hydrocarbons, and typical examples thereof include cyclohexane, cyclohexene, trichloroethylene, carbon tetrachloride, chlorobenzene, and the like.

The radiation which can be used in the above-described procedure for the purpose of forming a latent image includes ultraviolet rays (as produced by a mercury vapor lamp, a xenon lamp, and the like), vacuum ultraviolet rays (as produced by a heavy hydrogen discharge lamp, various gas discharge lamps, and the like), electron beams, soft X-rays, and gamma rays.

In the above-described procedure, the developing step is generally carried out with the aid of a liquid developer. The developer used for this purpose may be suitable selected from hydrocarbon solvents and halogenated hydrocarbon solvents. Among these solvents, tetrahydrofuran, trichloroethylene, chloroform, carbon tetrachloride, tetrachloroethane, chlorobenzene, cyclohexane, n-heptane, octan, n-decane, dipentene, toluene, diisobutylene, n-hexane, and decalin are preferred. By the action of the developer, the exposed portions of the photosensitive layer are dissolved and remived to form a positive image.

Prior to the developing step of the above-described procedure, the photosensitive layer having a latent image formed therein may be heat-treated at high temperatures, if necessary.

The positive image-forming material of the present invention serves not only to reduce the exposure dose required for the formation of a latent image but also to shorten the exposure time required therefor and, consequently, is suitable for use in mass production. Where electron beams are used, the required exposure dose ranges from about 0.5 to 4 $\mu c/cm^2$, which corresponds to form one-tenth to one-hundredth that required by polymethyl methacrylate known as a conventional image-forming material. Moreover, the positive image-forming material of the present invention has a $\gamma$-value of from 3 to 5 and a resolution of 1 $\mu m$ or less (for example, 0.5 $\mu m$). Accordingly, the positive image-forming material of the present invention is useful as an information recording material (used, for example, in holographic applications, in the manufacture of video discs, and the like) and as a mask or resist material (for example, as an anti-etching mask used in the manufacture of LSI and other semiconductor devices).

The present invention is further illustrated by the following examples.

EXAMPLE 1

A starting polymer- of 4-methyl-1-pentene having an intrinsic viscosity $[\eta]$ of 9.38 dl/g and a melting point of 237° C. as measured with a differential scanning calorimeter was degraded in the presence of dicumyl peroxide. As a result, a degraded polymer of 4-methyl-1-pentene having an intrinsic viscosity $[\eta]$ of 1.17 dl/g and melting points of 212° C. and 220° C. as measured with a differential scanning calorimeter was obtained.

Then, an image-forming solution containing 2% by weight of the degraded polymer was prepared by adding an appropriate amount of the polymer to cyclohexene, heating and shaking the resulting mixture at 70° C. to dissolve the polymer completely, and cooling the resulting solution to 25° C. The degraded polymer remained in solution at room temperature. Using a spinner, this solution was applied to a silicone wafer at room temperature to form thereon a photosensitive layer having a thickness of 0.5 $\mu m$, and the wafer was then prebaked at 200° C. Thereafter, using an electron beam lithographic apparatus, a latent image having a pattern width of 0.5 $\mu m$ was formed with electron beams having an exposure dose of 3.5 $\mu c/cm^2$ and a width of 0.5 $\mu m$. Then, the exposed photosensitive layer was developed by treating it with trichloroethylene at 18° C. for 15 seconds.

The positive image so formed had a pattern width of 0.5 $\mu m$ and a $\gamma$-value of 5. Thus, the degraded polymer of 4-methyl-1-pentene was found to achieve an approximately equal resolution at a lower exposure dose, as compared with polymethyl methacrylate known as a conventional image-forming material.

EXAMPLE 2

Three starting polymers of 4-methyl-1-pentene having different intrinsic viscosities $[\eta]$ and different melting points as measured with a differential scanning calorimeter were degraded in the presence of various free-radical initiators. As a result, seven degraded polymers of 4-methyl-1-pentene having different intrinsic viscosities $[\eta]$ and different melting points were obtained. The intrinsic voscosities $[\eta]$ and melting points of the starting polymers and of the degraded polymers are indicated in the Table given below.

Then, a solution containing each of the degraded polymers was prepared in the same manner as described in Example 1. This solution was applied to a silicone wafer to form a photosensitive layer thereon and, using an electron beam lithographic apparatus, a latent image was formed with electron beams having a width of 0.5 $\mu m$. Then, the exposed photosensitive layer was developed. The exposure dose and developing conditions used for each sample are indicated in the Table given below.

The characteristics of the seven positive images so formed were evaluated. The results are also indicated in the Table given below.

TABLE (1)

| Item | | Starting Polymer A $[\eta]$ = 9.38 dl/g m.p. 237° C. | | |
|---|---|---|---|---|
| Degraded Polymer | Sample Designation | $A_1$ | $A_2$ | $A_3$ |
| | Intrinsic Viscosity $[\eta]$ (dl/g) | 0.48 | 0.57 | 1.28 |
| | Melting Point (°C.) | 205, 217 | 213, 220 | 211, 218 |
| Exposure Dose of Electron beams ($\mu c/cm^2$) | | 4 | 4 | 3.5 |
| Developing Conditions | Developer | Trichloroethylene | Trichloroethylene | Trichloroethylene |
| | Developing Time (seconds) | 10 | 10 | 15 |
| | Developing Temperature (°C.) | 18 | 18 | 18 |
| Pattern Width ($\mu m$) | | 0.5 | 0.5 | 0.5 |
| $\gamma$-value | | 5 | 5 | 5 |

TABLE (2)

| Item | | Starting Polymer | | |
|---|---|---|---|---|
| | | A $[\eta]$ = 9.38 dl/g m.p. 237° C. | B $[\eta]$ = 26.8 dl/g m.p. 239° C. | C $[\eta]$ = 20.5 dl/g m.p. 237° C. |
| Degraded Polymer | Sample Designation | $A_4$ $A_5$ | $B_1$ | $C_1$ |
| | Intrinsic Viscosity $[\eta]$ (dl/g) | 3.71 4.12 | 1.26 | 1.36 |
| | Melting | 227, 232 227 | 208, 217 | 209, 218 |

TABLE (2)-continued

| Item | | Starting Polymer | | |
| --- | --- | --- | --- | --- |
| | | A<br>[η] = 9.38 dl/g<br>m.p. 237° C. | B<br>[η] = 26.8 dl/g<br>m.p. 239° C. | C<br>[η] = 20.5 dl/g<br>m.p. 237° C. |
| | Point (°C.) | | | |
| Exposure Dose of<br>Electron beams (μc/cm$^2$) | | 3 | 2.5 | 3 | 3 |
| Developing<br>Conditions | Developer | Trichloro-<br>ethylene | Trichloro-<br>ethylene | Trichloro-<br>ethylene | Trichloro-<br>ethylene |
| | Developing<br>Time<br>(seconds) | 30 | 30 | 15 | 15 |
| | Developing<br>Temperature<br>(°C.) | 18 | 18 | 18 | 18 |
| Pattern Width (μm) | | 0.5 | 0.5 | 0.5 | 0.5 |
| γ-value | | 3 | 3 | 5 | 5 |

What we claim is:

1. In a method of forming a positive image on a semiconductor substrate which comprises the steps of applying a solution of positive image-forming material in a solvent to said semiconductor substrate, prebaking the resulting photosensitive layer to remove said solvent therefrom, forming a latent image by exposure to ultraviolet rays or other forms of radiation, and then developing said photosensitive layer, the improvement comprising: said positive image-forming material consisting of a degradation product of 4-methyl-1-pentene homopolymer or a degradation product of a copolymer of 4-methyl-1-penetene and an α-olefin, said copolymer containing at least 80 mole percent of 4-methyl-1-pentene, said degradation product having an intrinsic viscosity of from 0.2 to 10.0 dl/g as measured in decalin at 135° C. and being soluble in not more than 100 times by weight of cyclohexene at 25° C.

2. The method according to claim 1 wherein said solvent is cyclohexane, cyclohexene, trichloroethylene, carbon tetrachloride, or chlorobenzene.

3. The method according to claim 1 wherein said step of applying a solution of a positive image-forming material in a solvent to said semiconductor substrate is carried out at room temperature.

4. The method according to claim 1 wherein said step of developing said photosensitive layer is carried out by dissolving and removing the exposed portions of said photosensitive layer with the aid of a developer selected from hydrocarbon and halogenate hydrocarbon.

5. The method according to claim 4 wherein the developer is selected from the group consisting of tetrahydrofuran, trichloroethylene, chloroform, carbon tetrachloride, tetrachloroethane, chlorobenzene, cyclohexane, n-heptane, octane, n-decane, dipentene, toluene, diisobutylene, n-hexane, or decalin.

6. The method according to claim 1 wherein said 4-methyl-1-pentene hompolymer or copolymer is a homopolymer or copolymer of 4-methyl-1-pentene which is obtained by providing a starting 4-methyl-1-pentene homopolymer or copolymer of 80 mole percent or more of 4-methyl-1-pentene with at least one other α-olefin as prepared by the Ziegler polymerization process and then degrading said starting 4-methyl-1-pentene homopolymer or copolymer in the presence of a free-radical initiator to produce a final product having an intrinsic viscosity of 0.4 to 5 dl/g and between 0.1 to 50% of that of the starting material.

* * * * *